(12) United States Patent
Murata

(10) Patent No.: US 7,282,649 B2
(45) Date of Patent: Oct. 16, 2007

(54) PRINTED CIRCUIT BOARD

(75) Inventor: Yuichiro Murata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 435 days.

(21) Appl. No.: 10/685,605

(22) Filed: Oct. 16, 2003

(65) Prior Publication Data
US 2004/0090757 A1    May 13, 2004

(30) Foreign Application Priority Data
Nov. 8, 2002    (JP) .............................. 2002-325883

(51) Int. Cl.
H01R 12/04    (2006.01)
H05K 1/11    (2006.01)

(52) U.S. Cl. .................... 174/261; 174/262; 439/60

(58) Field of Classification Search ................ 174/261, 174/262–266; 361/785–795; 439/60
See application file for complete search history.

(56) References Cited

U.S. PATENT DOCUMENTS

| | | | | |
|---|---|---|---|---|
| 4,621,880 A | * | 11/1986 | Rush | 439/83 |
| 4,904,968 A | * | 2/1990 | Theus | 333/246 |
| 4,992,052 A | * | 2/1991 | Verhoeven | 439/62 |
| 5,516,297 A | * | 5/1996 | Atoh et al. | 439/79 |
| 5,522,727 A | * | 6/1996 | Saito et al. | 439/65 |
| 6,072,699 A | * | 6/2000 | Horine | 361/777 |
| 6,464,540 B1 | * | 10/2002 | Sato | 439/668 |

FOREIGN PATENT DOCUMENTS

JP    2001-022486    1/2001

* cited by examiner

Primary Examiner—Jeremy C Norris
(74) Attorney, Agent, or Firm—Leydig, Voit & Mayer, Ltd.

(57) ABSTRACT

On the surface of a back board outermost-layer signal lines have different lengths. A difference in lengths of connector lines connected to the outermost-layer signal lines makes the total signal line lengths substantially equal. A digital signal generated in the circuit of a daughter board reaches a through hole through an internal-layer signal line traced within the internal layer of the daughter board, and is further transmitted to an internal-layer signal line of the back board through the a connector line, the an outermost-layer signal line, and a through hole. The digital signal is further transmitted to another internal-layer signal line via another through hole, another connector line, and another through hole.

5 Claims, 3 Drawing Sheets

PRINTED CIRCUIT BOARD

BACKGROUND OF THE INVENTION

1. Field of the Invention

The present invention relates to signal transmission in a printed circuit board (PCB).

2. Description of the Related Art

Generally, high-speed transmission of a plurality of signals requires that a difference in transmission time between the signals (referred to as a skew hereinafter) be decreased as far as possible. It is necessary to greatly reduce a skew between the differential pairs of differential signals in order to achieve high-speed digital signal transmission on the LVDS (low voltage differential signaling) system, for instance.

There has been on the one hand some conventional electronics in which a plurality of specific signals whose delay amount should be matched are assigned to connector terminals of the same connector type, respectively to thereby reduce the skew between those signals to a minimum. Moreover, there has been on the other hand some conventional electronics using the trace pattern of signal lines, where the signal line of which length from a serial transfer controller to a connector terminal is longest is traced straight and signal line other than the above signal line is provided with a bent portion such that the length thereof comes to be the same as that of the signal line. For instance, JP, 2001-022486, A (pp. 4, FIG. 1) discloses an electronics in which the skew is reduced to a minimum by adopting these techniques.

Incidentally, a technique for transmitting a plurality of signals in a PCB has been developed, in which a plurality of signal lines are traced in the internal layers of the board. The terminals of the internal-layer signal line are connected with another device via through holes formed in the PCB. Such a technique entails a demand for reduction of the skew while the influence due to a reflection characteristic of the through holes is decreased to a minimum.

SUMMARY OF THE INVENTION

The present invention has been made to solve the above-mentioned problem. An object of the present invention is to provide a PCB in which the influence due to a reflection characteristic of the through holes is decreased to a minimum with reduced the skew.

The PCB according to the present invention includes a plurality of internal-layer signal lines traced within an internal layer of the PCB; and a plurality of outermost-layer signal lines traced on the surface of the PCB and they are connected with each of the internal-layer signal lines via through holes; wherein the outermost-layer signal lines are each connected with a plurality of connector lines of a connector mounted on a surface of the PCB, and the lengths of the outermost-layer signal lines are different from each other on the basis of the lengths of the connector lines.

Therefore, according to the present invention, it allows cancellation of the skew generated in the connector by the outermost-layer signal line. Because the signal has not reached the through hole at the time the skew is cancelled by the outermost-layer signal line, secure cancellation of the skew generated in the connector is guaranteed without being subject to the influence of a reflection characteristic of the through holes.

DETAILED DESCRIPTION OF THE PREFERRED EMBODIMENTS

Preferred embodiments of the present invention will now be described below with reference to the attached drawings.

First Embodiment

Figure 1:
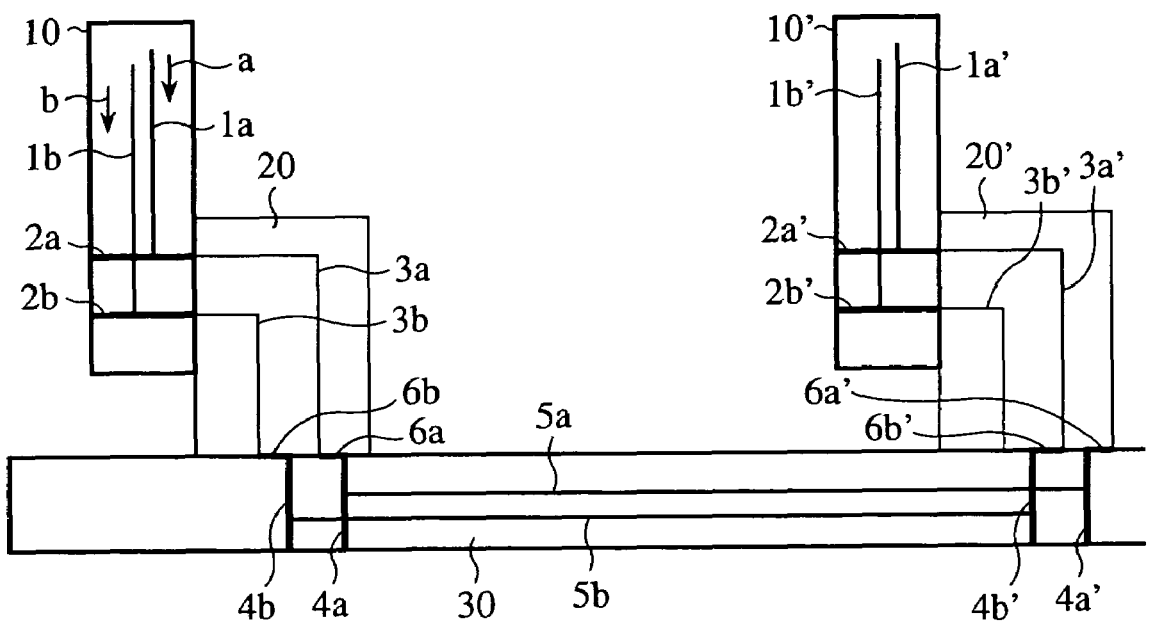
FIG. 1 is a sectional view of the PCB and the connector according to a first embodiment of the present invention.

FIG. 1 is a sectional view of the PCB and the connector according to the first embodiment of the present invention. As shown in FIG. 1, two daughter boards 10, 10' are connected with a back board 30 through connectors 20, 20', respectively. It is arranged such that a driver IC (not shown) and a receiver IC (not shown) are mounted on the daughter boards 10, 10', respectively, and that a signal is transmitted from the daughter board 10 to the daughter board 10'.

Daughter boards and back board are constructed by a multilayer PCB, and has a plurality of dielectric layers and signal lines that are formed of conductors, and are interposed between these dielectric layers. In FIG. 1, the daughterboard 10 has internal-layer signal lines $1a$, $1b$; the daughter board 10' has internal-layer signal lines $1a'$, $1b'$; and the back board 30 has internal-layer signal lines $5a$, $5b$. Although the internal-layer signal lines of each substrate are traced within different layers in FIG. 1, the lines may of course be traced within the same layer.

Moreover, in each of the PCB are formed through holes in which a conductor is each provided, and each of the through holes is connected with the internal-layer signal line. In FIG. 1, in the daughter board 10, the internal-layer signal lines $1a$, $1b$ are connected with the through holes $2a$, $2b$, respectively; in the daughter board 10', the internal-layer signal lines $1a'$, $1b'$ are connected with the through holes $2a'$, $2b'$, respectively; and in the back board 30, the internal-layer signal line $5a$ is connected with the through holes $4a$, $4a'$, and the internal-layer signal line $5b$ is connected with the through holes $4b$, $4b'$.

In addition, on the surface of the back board 30 are traced outermost-layer signal lines $6a$, $6b$, $6a'$, $6b'$; the outermost-layer signal lines $6a$, $6b$ are connected with the through holes $4a$, $4b$, respectively; and the outermost-layer signal lines $6a'$, $6b'$ are connected with the through holes $4a'$, $4b'$, respectively.

The connector 20 has connector lines $3a$, $3b$ therein. On the side of the connector 20 are provided two connector pins projecting therefrom (not shown) that are the extensions of the connector lines $3a$, $3b$. The daughter board 10 and the connector 20 are bonded to each other by press-fitting the connector pins, which is projecting from the connector 20, into the through holes $2a$, $2b$. Moreover, the back board 30 and the connector 20 are bonded to each other by soldering using a method such as ball grid array (BGA). This bondage electrically connects the outermost-layer signal lines $6a$, $6b$ of the back board 30 with the connector lines $3a$, $3b$, respectively.

The daughter board 10' and the connector 20' are connected to each other in the same way as the daughter board 10 and the connector 20, and the back board 30 and the connector 20' are connected to each other in the same way as the back board 30 and the connector 20.

The internal-layer signal line 1a traced on an internal layer of the daughter board 10 is connected with the connector line 3a by press-fitting the connector pin into the through hole 2a. The connector line 3a is connected with the through hole 4a through the outermost-layer signal line 6a traced on the outermost layer of the back board 30, and further connected with the internal-layer signal line 5a of the back board 30. The internal-layer signal line 5a is connected with the outermost-layer signal line 6a' via the through hole 4a', and further connected with the internal-layer signal line 1a' through the connector line 3a' and the through hole 2a'. The above-mentioned route extending from the internal-layer signal line 1a to the internal-layer signal line 1a' is referred to as a first route.

Similarly, the internal-layer signal line 1b is connected with the connector line 3b by press-fitting the connector pin into the through hole 2b. The connector line 3b is connected with the through hole 4b through the outermost-layer signal line 6b, and further connected with the internal-layer signal line 5b. The internal-layer signal line 5b is connected with the outermost-layer signal line 6b' via the through hole 4b', and further connected with the internal-layer signal line 1b' through the connector line 3b' and the through hole 2b'. The above-mentioned route extending from the internal-layer signal line 1b to the internal-layer signal line 1b' is referred to as a second route.

Supposing that a "digital signal a" generated in the circuit of the daughter board 10 is transmitted to the daughter board 10' through the first route. Furthermore, assuming that another "digital signal b" generated in the circuit of the daughter board 10 is transmitted to the daughter board 10' through the second route.

In the first embodiment, the outermost-layer signal lines 6a, 6b is traced on the first layer of the back board 30, and that the outermost-layer signal lines 6a, 6b are connected with the connector lines 3a, 3b, respectively. It is arranged such that the lengths of these outermost-layer signal lines 6a, 6b are different from each other on the basis of the difference in length between the corresponding connector lines 3a, 3b.

It is preferable that the difference in length between the outermost-layer signal lines 6a and 6b (let it equal to A) is equal to the difference in length between the connector lines 3a and 3b (let it equal to B) whenever possible. Preferably, the difference in length between A and B is 5 mm or less, more preferably, it is 3 mm or less, and most preferably, it is 1 mm or less. Such a decrease in the difference between A and B, that is, the approximation of the total length of the outermost-layer signal line 6a and the connector line 3a to that of the outermost-layer signal line 6b and the connector line 3b as close as possible leads to reduction of the skew generated in the connector.

Figure 2A:
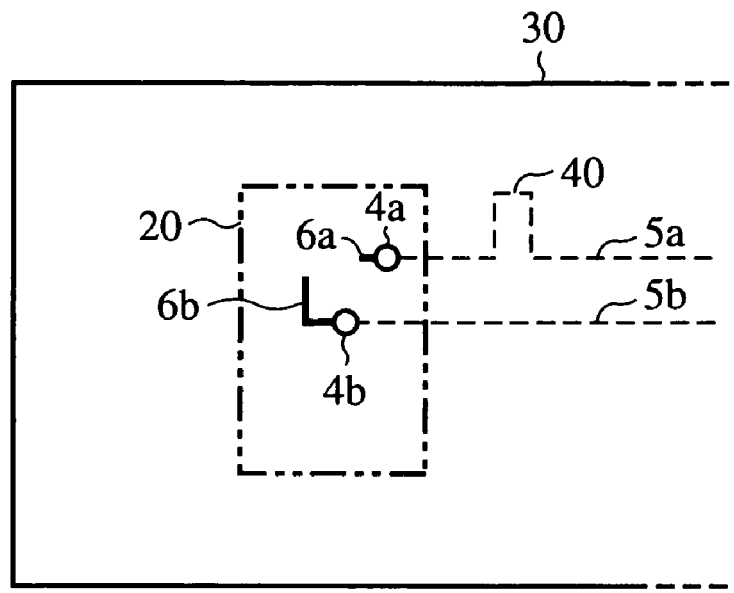
FIG. 2A is a partial plan view of the back board (PCB) shown in FIG. 1.

FIG. 2A is a plan view of the back board 30 of the signal transmission side shown in FIG. 1. Because the length of the connector line 3a is longer than that of the connector line 3b, the length of the outermost-layer signal line 6a corresponding to the connector line 3a is shorter than that of the outermost-layer signal line 6b as shown in FIG. 2A. Within the outermost-layer signal line 6b is provided a bent portion, to thereby make the length thereof longer than that of the outermost-layer signal line 6a. Thus, the skew generated in the connector can be cancelled by the outermost-layer signal lines 6a and 6b. Because the digital signals a and b have not reached the through holes 4a, 4b at the time the skew is cancelled in the outermost-layer signal lines 6a, 6b, the adjustment of the skew generated in the connector is not subject to the influence of a reflection characteristic of the trough holes. Moreover, the skew generated between the internal-layer signal lines is adjusted by regulating the length of internal-layer signal line 5a in a skew-adjusting portion 40.

As mentioned above, according to the first embodiment, since the total length of the connector line 3a and the outermost-layer signal line 6a is substantially equal to that of the connector line 3b and the outermost-layer signal line 6b, it allows cancellation of the skew generated in the connector by the outermost-layer signal lines. Because the digital signals a, b have not reached the through holes 4a, 4b at the time the skew is cancelled in the outermost-layer signal lines, it permits cancellation of the skew generated in the connector without being subject to the influence of a reflection characteristic of the trough holes.

Figure 2B:
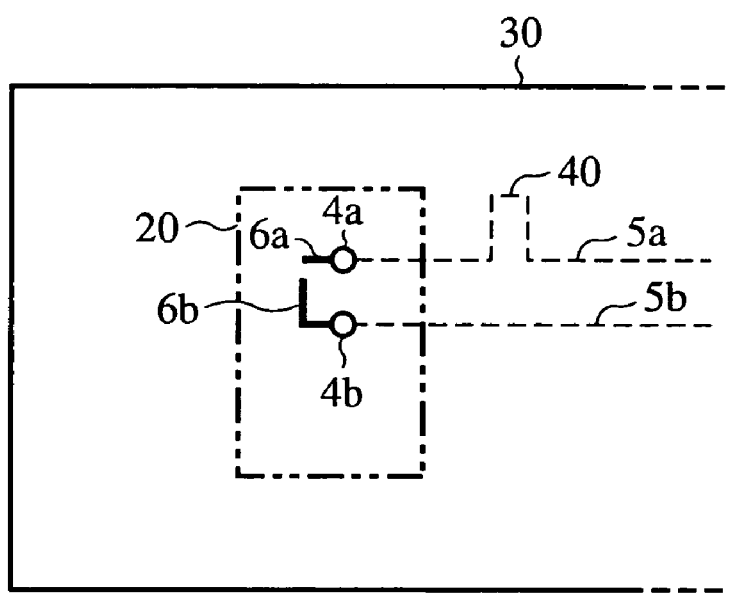
FIG. 2B is a partial plan view of the back board showing a variation of the first embodiment.

In addition, FIG. 2B is a plan view of the back board 30 showing a variation of the first embodiment. As shown in FIG. 2B, it is possible for the outermost-layer signal lines and the internal-layer signal lines to trace in various patterns in conformity with the conditions of the mounting of a connector.

Second Embodiment

Figure 3:
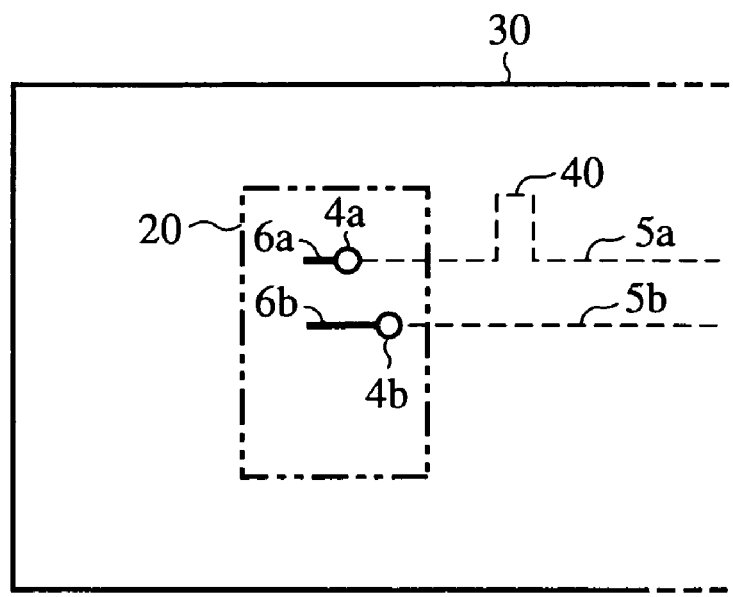
FIG. 3 is a partial plan view of the back board according to a second embodiment.

FIG. 3 is a plan view of the back board at the signal transmission side according to the second embodiment. In FIG. 3, the same reference numeral as FIG. 1 indicates the same elements, and therefore the detailed description thereof is omitted for brevity's sake. FIG. 3 shows a signal line pattern different from that in the first embodiment.

In the first embodiment, a bent portion is provided to the outermost-layer signal lines 6a, 6b. For this reason, it is apprehended that the influence would be exerted by reflection of a signal on the bent portion, that is, impedance might be increased. The second embodiment provides no bent portion to the outermost-layer signal lines 6a, 6b, but traces the signal lines straight. Such signal line as above makes it possible to obtain the same effect as with the first embodiment, and to adjust the skew without being subject to the influence of the reflection of a signal on the bent portion there being provided no bent portion to the signal lines.

Third Embodiment

Figure 4:
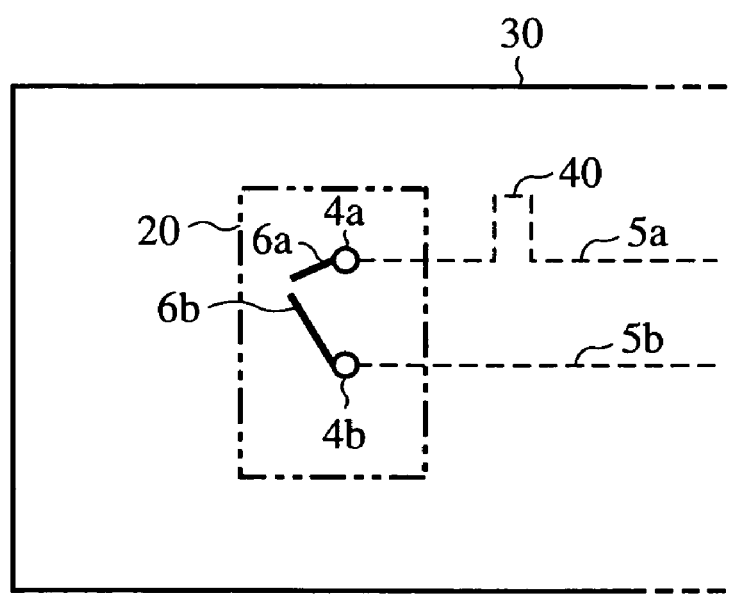
FIG. 4 is a partial plan view of the back board according to a third embodiment.

FIG. 4 is a plan view of the back board at the signal transmission side according to the third embodiment. In FIG. 4, the same reference numeral as FIG. 1 indicates the same elements, and therefore the detailed description thereof is omitted for brevity's sake. FIG. 4 shows a signal line pattern different from that in the first embodiment.

Referring to FIG. 4, the outermost-layer signal lines 6a, 6b are traced straight without provision of a bent portion to the signal lines, and the signal lines are traced with the length between the tip ends of the outermost-layer signal lines 6a and 6b shortened compared with that between the tip ends of the outermost-layer signal lines 6a and 6b shown in the second embodiment. Thus, it is possible to comply with the various patterns of the connector lines for the reason that the outermost-layer signal lines may have freedom to trace themselves in various patterns. The third embodiment exerts the effect similar to that of the first embodiment.

While in the above respective embodiments, descriptions are given to the typical case in which the skew generated between two signal lines is adjusted, the present invention may be applied as a matter of course to the adjustment of the skew generated between the pairs of differential signal lines used in LVDS, for instance. In addition, the present invention may also be applied to the adjustment of the skew generated between two or more signal lines.

What is claimed is:

1. A printed circuit board comprising:
    external surfaces and a plurality of internal-layer signal lines traced within an internal layer of the printed circuit board between the external surfaces; and
    a plurality of outermost-layer signal lines traced on one of the external surfaces of the printed circuit board and connected with respective internal-layer signal lines through via holes, wherein the outermost-layer signal lines are each connected with respective connector lines of a connector mounted on one of the external surfaces of the printed circuit board, and total lengths of respective outermost-layer signal lines and connector lines of the connector connecting corresponding outermost-layer signal lines to respective connected via holes are substantially equal.

2. The printed circuit board according to claim 1, wherein the outermost-layer signal lines are each straight and are free of bends.

3. The printed circuit board according to claim 1, wherein the plurality of outermost signal lines and the connector lines comprise two outermost signal lines connected to respective connector lines of the connector as a differential pair, and the total lengths of each of the outermost signal lines and the respective connector lines of the differential pair are substantially equal.

4. The printed circuit board assembly according to claim 1, wherein the outermost-layer signal lines are each straight and are free of bends.

5. A printed circuit board arrangement comprising:
    a printed circuit board including external surfaces, a plurality of internal-layer signal lines traced within an internal layer of the printed circuit board between the external surfaces, and a plurality of outermost-layer signal lines traced on one of the external surfaces of the printed circuit board and connected with respective internal-layer signal lines through via holes; and
    a connector mounted on one of the external surfaces of the printed circuit board and including a plurality of connector lines, wherein the outermost-layer signal lines are each connected with respective connector lines of the connector mounted on one of the external surfaces of the printed circuit board, and total lengths of respective outermost-layer signal lines and the connector lines of the connector connecting corresponding outermost-layer signal lines to respective connected via holes are substantially equal.

* * * * *